(12) United States Patent
Tyan et al.

(10) Patent No.: US 6,861,800 B2
(45) Date of Patent: Mar. 1, 2005

(54) TUNED MICROCAVITY COLOR OLED DISPLAY

(75) Inventors: Yuan-Sheng Tyan, Webster, NY (US); Giuseppe Farruggia, Webster, NY (US); Joel D. Shore, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 72 days.

(21) Appl. No.: 10/368,513

(22) Filed: Feb. 18, 2003

(65) Prior Publication Data

US 2004/0160172 A1 Aug. 19, 2004

(51) Int. Cl.[7] .................................................. H01J 1/62
(52) U.S. Cl. ...................... 313/506; 313/505; 313/504; 313/113
(58) Field of Search ................................ 313/504, 505, 313/506, 113; 315/169.3; 345/76; 257/98; 438/35

(56) References Cited

U.S. PATENT DOCUMENTS

| | | | |
|---|---|---|---|
| 4,769,292 A | | 9/1988 | Tang et al. |
| 5,405,710 A | | 4/1995 | Dodbalapur et al. |
| 5,554,911 A | | 9/1996 | Nakayama et al. |
| 5,559,400 A | * | 9/1996 | Nakayama et al. ......... 313/506 |
| 5,780,174 A | | 7/1998 | Tokito et al. |
| 5,814,416 A | * | 9/1998 | Dodabalapur et al. ...... 428/690 |
| 5,847,506 A | | 12/1998 | Nakayama et al. |
| 5,969,475 A | | 10/1999 | Friend et al. |
| 6,037,190 A | * | 3/2000 | Chao et al. ................... 438/35 |
| 6,326,224 B1 | | 12/2001 | Xu et al. |
| 6,406,801 B1 | | 6/2002 | Tokito et al. |
| 6,639,250 B1 | * | 10/2003 | Shimoda et al. .............. 257/98 |
| 2003/0044639 A1 | * | 3/2003 | Fukuda ......................... 313/504 |
| 2003/0137239 A1 | * | 7/2003 | Matsuura et al. ........... 313/503 |
| 2004/0012330 A1 | * | 1/2004 | Ohshita et al. .............. 313/504 |
| 2004/0140757 A1 | * | 7/2004 | Tyan et al. ................... 313/504 |
| 2004/0140758 A1 | * | 7/2004 | Raychaudhuri et al. ..... 313/504 |

FOREIGN PATENT DOCUMENTS

| | | |
|---|---|---|
| EP | 1154676 | 11/2001 |
| JP | 11-288786 | 10/1999 |

OTHER PUBLICATIONS

Tang et al, Organic electroluminescent diodes, Appl. Phys. Lett. 51 (12), Sep. 21, 1987, pp. 913–915.
Yokoyama, Physics and Device Applications of Optical Microcavities, Science Vo. 256, Apr. 3, 1992, pp. 66–70.
Jordan et al, Efficiency enhancement of microcavity organic light emitting diodes, Appl. Phys. Let. 69 (14), Sep. 30, 1996, pp. 1997–1999.
Tang et al, Electroluminescence of doped organic thin films, J. Appl. Phys. 65 (9) May 1, 1989, pp. 3610–3616.

(List continued on next page.)

Primary Examiner—Vip Patel
Assistant Examiner—Glenn Zimmerman
(74) Attorney, Agent, or Firm—Raymond L. Owens

(57) ABSTRACT

A color organic light-emitting display device having an array of pixels divided into at least two different color pixel sets each color pixel set emitting a different predetermined color light over a common substrate, wherein each pixel in the array includes a metallic bottom-electrode layer disposed over the substrate and a metallic electrode layer spaced from the metallic bottom-electrode layer; wherein the material for reflective metallic electrode layer includes Ag, Au, Al, or alloys thereof, the material for the semitransparent metallic electrode layer includes Ag, Au, or alloys thereof; and wherein the thickness of the semitransparent metallic electrode layer, the combined thickness of the organic layers and the transparent conductive phase-layer, and the placement of the light-emitting layer are selected so that each pixel in the display forms a tuned microcavity OLED device having an emission output efficiency above that of a comparable OLED device without the microcavity.

25 Claims, 7 Drawing Sheets

OTHER PUBLICATIONS

Berggren et al, Polymer light–emitting diodes placed in microcavities, Synthetic Materials 76 (1996), pp. 121–123.

Takada et al, Control of emission characteristics in organic tin film electroluminescent diodes using an optical–microcavity in structure, Appl. Phys. Lett. 63 (15) Oct. 11, 1993, pp. 2032–2034.

Jean et al, Microcavity organic light–emitting diodes on silicon, Appl. Phys. Lett. vol. 81, No. 9, Aug. 26, 2002, pp. 1717–1719.

Lu et al, High efficiency top–emitting organic light–emitting devices, Appl. Phys. Lett. vol. 81, No. 21, Nov. 18, 2002, pp. 3921–3923.

* cited by examiner

TUNED MICROCAVITY COLOR OLED DISPLAY

CROSS REFERENCE TO RELATED APPLICATIONS

Reference is made to commonly assigned U.S. patent application Ser. No. 10/369,416 filed Feb. 18, 2003, entitled "White Emitting Organic Electroluminescent Device with Color Filters to Improve Efficiency" by Dustin Winters et al, U.S. patent application Ser. No. 10/346,424 filed Jan. 17, 2003 entitled "Microcavity OLED Devices" by Yuan-Sheng Tyan et al; U.S. patent application Ser. No. 10/347,013 filed Jan. 17, 2003, entitled "Organic Light-Emitting Diode Display With Improved Light Emission Using Metallic Anode" by Pranab K. Raychaudhuri et al, and U.S. patent application Ser. No. 10/356,271 filed Jan. 31, 2003 entitled "Color OLED Display with Improved Emission" by Yuan-Sheng Tyan et al, the disclosures of which are incorporated herein by reference.

FIELD OF INVENTION

The present invention relates to an improved tuned microcavity color OLED display device.

BACKGROUND OF INVENTION

Organic electroluminescent (EL) devices or organic light-emitting diodes (OLEDs) are electronic devices that emit light in response to an applied potential. Tang et al. (Applied Physics Letters, 51, 913 (1987), Journal of Applied Physics, 65, 3610 (1989), and commonly assigned U.S. Pat. No. 4,769,292) demonstrated highly efficient OLEDs. Since then, numerous OLEDs with alternative layer structures, including polymeric materials, have been disclosed and device performance has been improved. FIG. 1 illustrates schematically the cross-sectional view of a prior art bottom-emitting OLED. Prior art bottom-emitting OLED device 101 includes a substrate 10, a transparent bottom-electrode 12a, an organic EL element 14, and a reflective metallic top-electrode 16R. The organic EL element 14 can include one or more sub-layers including a hole-injection layer (HIL) 14a (not shown), a hole transport layer (HTL) 14b, a light-emitting layer (LEL) 14c, an electron transport layer (ETL) 14d, and an electron-injection layer (EIL) 14e (not shown). In FIG. 1 the transparent bottom-electrode 12a is the anode and the reflective metallic top-electrode 16R is the cathode; but the reverse can also be the case and if so the order of the sub-layers in the organic EL element 14 is reversed.

One of the most promising applications for OLED devices is to use them in color organic light-emitting displays. A color organic light-emitting display is a device comprising more than one area or pixel that emits more than one color. When the size of the individual areas is relatively large and the number of individual areas is small, the display is generally referred to as an area color display. When the size of the individual areas is small but the number is large, the display is generally referred to as a pixelated display. The latter is the preferred device for applications that need to display high-resolution full color images. Most commonly, the pixels are divided into three different color pixel sets each of which emits a primary color of blue, green, or red. By applying different combinations of powers to drive the pixels, a full color image can be displayed.

Several different methods have been attempted to provide the different colored pixels. The most direct way is to dispose different colored emitting layers to different pixels. This can be done for small molecule OLED devices by using shadow masks during the vapor deposition process to selectively deposit the different colored emitter materials to different pixels. Although this method has been demonstrated to fabricate high performance devices, the process is complicated when high resolution pixels are required. The shadow masks are expensive and the alignment of masks is difficult. An alternative method that has been proposed is to use close-spaced vapor transport using a scanning laser beam. Although the use of shadow masks can be eliminated, the equipment is complicated and high quality devices have not been reported. Another method that is particularly suitable for fabricating polymer based OLED devices is to use ink-jet printing to deposit the emitter materials at the desired pixel locations. Although the method is attractive, it has been difficult to fabricate high performance, stable devices.

A different approach is to use a common emitter for all pixels and then create different colors using other means. For example, a white emitting OLED can be used in combination with color filters for different pixels to generate different colors. The major drawback, in addition to the cost of providing the color filters, is the loss of about two-thirds of light by the absorption of the filters. An alternative approach is to use a blue emitting OLED in combination with different florescent materials for different pixels to generate different colors. Since blue emitting OLED devices are generally less stable and less efficient than other OLEDs, this method has fundamental deficiencies.

Yet another proposed approach is to use a microcavity for pixelation. In a microcavity OLED device (U.S. Pat. Nos. 6,406,801 B1; 5,780,174 A1, and JP 11,288,786 A) the organic EL element is disposed between two highly reflecting mirrors, one of which is semitransparent. The reflecting mirrors form a Fabry-Perot microcavity that strongly modifies the emission properties of the organic EL element disposed in the cavity. Emission near the wavelength corresponding to the resonance wavelength of the cavity is enhanced through the semitransparent mirror and emission at wavelengths away from the resonance is suppressed. The use of microcavity in OLED devices has been shown to reduce the emission bandwidth and improve the color purity of emission (U.S. Pat. No. 6,326,224). There also have been suggestions that the luminance output could be enhanced by the use of microcavity [Yokoyama, Science, Vol. 256 (1992) p66; Jordan et al Appl. Phys. Lett. 69, (1996) p1997]. There have been proposals to achieve pixelation by using the color selectivity of the microcavities. The proposal was to provide a broadband emitter and to provide different microcavity length for different pixels (U.S. Pat. Nos. 5,554,911; 5,847,506; 5,969,475; and 5,405,710). Although the proposal has merits, the practical application of the proposed concepts has been difficult because in these and other prior art disclosures on microcavity OLED devices at least one of the reflecting mirrors is a Quarter Wave Stack (QWS). A QWS is a multi-layer stack of alternating high index and low index dielectric thin-films, each one a quarter wavelength thick. It can be tuned to have high reflectance, low transmittance, and low absorption over a desired range of wavelength.

FIG. 2 illustrates schematically the cross-sectional view of an exemplary prior art QWS based microcavity OLED device 102. QWS based microcavity OLED device 102 includes a substrate 10, a QWS reflecting mirror 18 as a semitransparent reflector, a transparent bottom-electrode 12a, an organic EL element 14, and a reflective metallic top-electrode 16R. A typical QWS reflecting mirror 18 is of the form $TiO_2:SiO_2:TiO_2:SiO_2:TiO_2$ with $TiO_2$ n=2.45 and SiO₂ n=1.5 [as in R. H. Jordan et al., Appl. Phys. Lett 69, 1997 (1996)]. Thickness of each material is 56 nm and 92 nm, respectively, corresponding to quarter wavelength for green emission at 550 nm. In operation only a narrow band light centered at the resonance wavelength of 550 nm is emitted through the QWS layer out of the microcavity OLED device.

A QWS is complicated in structure and expensive to fabricate. The resonance bandwidth is extremely narrow and, as a result, even though a microcavity based on a QWS is capable of greatly increasing the emission peak height at the resonance wavelength, the total luminance integrated over wavelength is much less improved and can actually decrease over a similar device without the microcavity. In addition, the dielectric layers are not electrically conductive. To form a functional OLED device, a separate transparent conductive electrode layer needs to be disposed between the QWS and the organic layers. This added conductive electrode layer further complicates the structure. If a transparent conductive oxide is used as the conductive electrode, the electrical conductance is limited and can be inadequate for many devices especially those having large areas. If a thin metal film is used, the cavity structure is much more complicated and device performance can be compromised. QWS-based microcavity OLED devices are therefore not suitable for practical color organic light-emitting displays.

It is generally believed, however, that a QWS constructed of non-absorbing dielectric materials is necessary in achieving useful microcavity effects. Yokoyama et al [Science V256, p 66 (1992)] in his well-referenced review article specifically recommended the use of a QWS instead of metallic mirrors. Published attempts to replace the QWS have not been very successful. Berggrem et al. [Synthetic Metals 76 (1996) 121] studied a PLED using an Al mirror and a Ca—Al semitransparent mirror to construct a microcavity. Although some bandwidth narrowing was observed suggesting microcavity effect, the external quantum efficiency of the device with microcavity was a factor of three less than a similar device without microcavity. Takada et al [Appl. Phys. Lett. 63, 2032 (1993)] constructed a microcavity OLED device using a semitransparent (36 nm) Ag cathode and a 250 nm MgAg anode. Although angular distribution change and emission bandwidth reduction were observed, the emission intensity was significantly reduced compared with a non-cavity case. The authors concluded that the combination of emission dyes with broad emission spectra and a simple planar cavity was not satisfactory for the confinement of light in the microcavity, and encouraged development of new cavity structures. Jean el al [Appl. Phys. Lett., Vol 81, (2002) 1717] studied an OLED structure using a 100 nm Al as the anode and 30 nm Al as the semitransparent cathode to construct a microcavity structure. Although a strong microcavity-effect-caused emission bandwidth narrowing and strong angular dependence was observed, no improvement in emission output efficiency was suggested. In fact, judging from the extremely narrow emission bandwidth of the devices, the emission output efficiency was most likely decreased. EP 1,154,676, A1 disclosed an organic EL device having a bottom-electrode of a light reflective material, an organic light-emitting layer, a semitransparent reflection layer, and a top-electrode of a transparent material forming a cavity structure. The objective was to achieve an OLED device with sufficient color reproduction range over a wide viewing angle. The objective was achieved by reducing the microcavity effect to achieve a large emission bandwidth. Although it alleged that multiple reflection enhances resonance wavelength emission, no actual or simulated data supported the suggestion. All examples used a Cr reflective anode. The evidence shows that little luminance enhancement is achievable when an anode with reflectivity as low as Cr is used.

Lu et al. (Appl. Phys. Lett. 81, 3921 (2002)) described top-emitting OLED devices that the authors alleged to have performance enhanced by microcavity effects. However, their performance data showed very little angular dependence characteristic of microcavities. Although no spectral data were shown, the similarity in color coordinates between their non-cavity bottom-emitting structure and microcavity top-emitting structure suggests that the bandwidth narrowing effect expected in microcavity OLED devices is most likely absent as well. Indeed, our model calculations confirm that their structure should not produce a significant microcavity effect. Thus, the observed emission enhancement is most likely a result of normal modest optical interference effects typically seen in non-microcavity OLED devices. The magnitude of the emission enhancement is very small and the color quality improvement is absent. The authors also suggested that the best efficiency is achieved by using a high reflectivity anode and a transparent cathode, the latter being clearly contrary to the teaching of the present invention.

SUMMARY OF THE INVENTION

It is an object of the present invention to provide a tuned microcavity color organic light-emitting display that can be easily fabricated.

It is an further object of the present invention to provide a color organic light-emitting display with substantially improved color quality or emission output efficiency.

It is another object of the present invention to provide a color organic light-emitting display with a low internal series resistance to reduce power loss.

These objects are achieved by providing a color organic light-emitting display device having an array of pixels divided into at least two different color pixel sets each color pixel set emitting a different predetermined color light over a common substrate, wherein each pixel in the array includes:

a metallic bottom-electrode layer disposed over the substrate;

a metallic top-electrode layer spaced from the metallic bottom-electrode layer;

an organic EL element disposed between the top-electrode layer and the bottom-electrode layer and arranged to produce broadband light; and a transparent conductive phase-layer disposed between the metallic bottom-electrode layer and the organic EL element;

wherein the organic EL element is common for all color pixels; wherein the thickness of the transparent conductive phase-layer is separately selected for pixels in different color pixel sets to cause the pixels in different color pixel sets to emit the different predetermined color light; wherein one of the metallic electrode layers is semitransparent and the other one is essentially opaque and reflective; wherein the material for reflective metallic electrode layer includes Ag, Au, Al, or alloys thereof, the material for the semitransparent metallic electrode layer includes Ag, Au, or alloys thereof; and wherein the thickness of the semitransparent metallic electrode layer, the combined thickness of the organic layers and the transparent conductive phase-layer, and the placement of the light-emitting layer are selected so that each pixel in the display forms a tuned microcavity OLED device having an emission output efficiency above that of a comparable OLED device without the microcavity.

In another aspect of the present invention, a igh index of refraction absorption-reduction layer is added next to the semitransparent metallic electrode layer outside the microcavity to further improve the performance of the microcavity OLED devices.

DETAILED DESCRIPTION OF THE PREFERRED EMBODIMENTS

Figure 1:
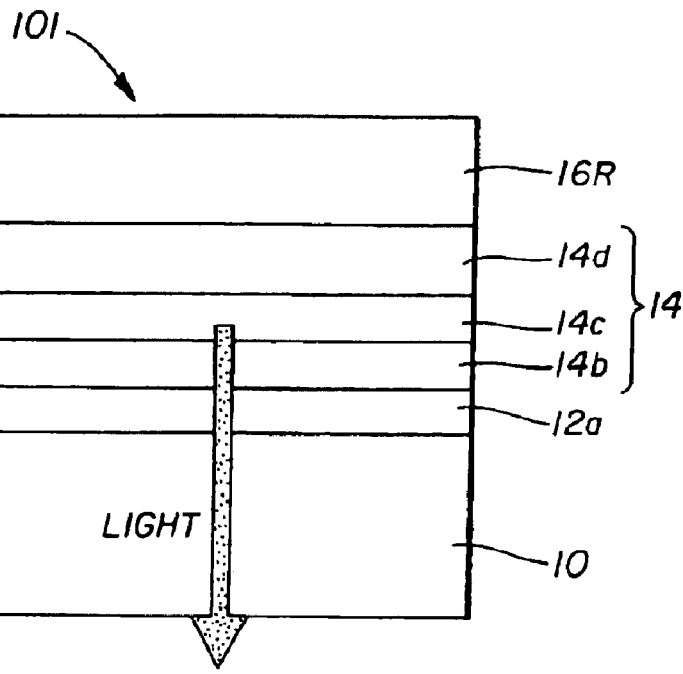
FIG. 1 is a schematic cross-sectional view of a prior art OLED device.
Figure 2:
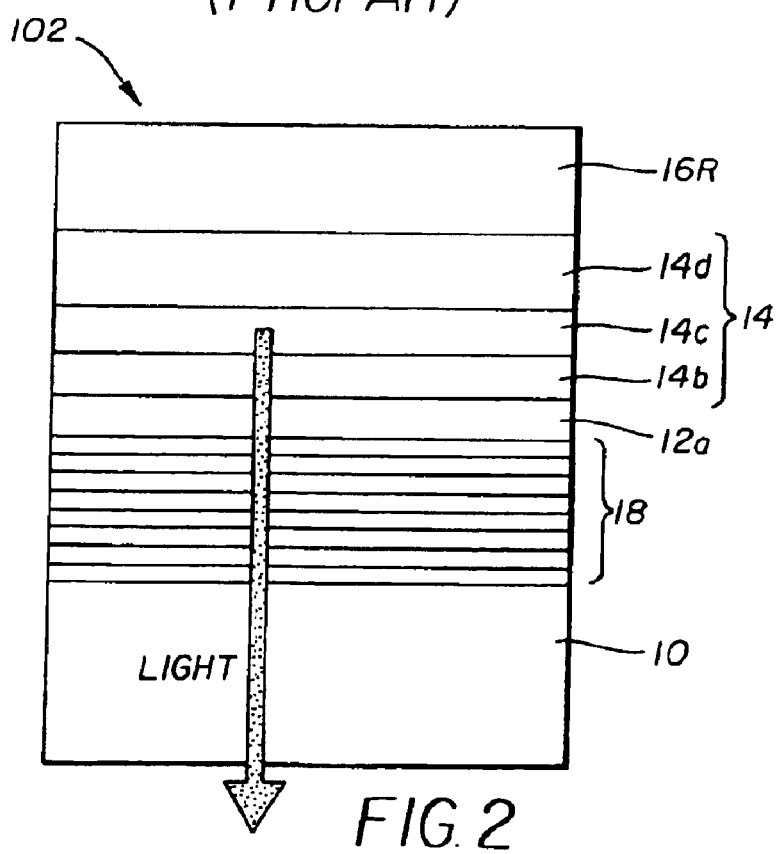
FIG. 2 is a schematic cross-sectional view of a prior art microcavity OLED device based on a QWS.

In a preferred embodiment of the present invention, the color organic light-emitting display has an array of pixels divided into at least two color pixel sets each emitting a different predetermined color over a common substrate. Each pixel in the color organic light-emitting display device is constructed to be a microcavity OLED device having two metallic electrode layers. Each pixel includes a metallic bottom-electrode layer disposed over the substrate and a metallic top-electrode layer spaced from the metallic bottom-electrode layer. A common organic EL element arranged to produce a broadband light for all the pixels is disposed between the bottom and top electrode layers. In addition, a different thickness transparent conductive phase-layer is disposed between the metallic bottom-electrode layer and the organic EL element for pixels in different color pixel sets. Pixels in different color pixel sets are thereby constructed to be microcavity OLED devices with different cavity length. Since the cavity length of a microcavity OLED device determines its emission color, pixels in different color pixel sets are thereby constructed to produce different color lights from a common broadband emitter. A full color organic light-emitting display with pixels divided into at least two different color pixel sets can therefore be constructed without the need to provide different color-emitting organic EL elements for different pixels. The fabrication cost for the organic color light-emitting display device can therefore be reduced. Furthermore, a key feature of the present invention is that it achieves emission efficiency enhancement through the use of these microcavities. Although all-metal microcavity OLED devices have been studied and reported in the prior art, to our knowledge there has been no success in achieving enhanced emission output efficiency over corresponding non-microcavity devices. For the purpose of the present invention, the emission output efficiency of an OLED device is measured by integrating the radiant energy output of the device over a spectrum range from about 0.95 $\lambda_o$ to about 1.05 $\lambda_o$, wherein $\lambda_o$ is the peak wavelength of the intended color emitting from the pixel of interest. For example, for a green pixel that emits at 520 nm peak wavelength, the emission output efficiency is measured by integrating the radiant output of the device from about 494 nm to about 546 nm. This definition of emission output efficiency is used to make sure that only the emitted light that contributes to the desired color output is compared.

In view of the teaching and the unsuccessful attempts of the prior art, it has been discovered quite unexpectedly through extensive modeling and experimental efforts that high performance microcavity OLED devices that enhance the light emission output efficiency and color quality and that provide color selectivity can actually be fabricated using all metallic mirrors. It was discovered that the material selection for both the reflecting and the semitransparent metallic electrodes is important and the thickness of the semitransparent metallic electrode is also important. Only a small number of metals, including Ag, Au, Al, or alloys thereof, defined as alloys having at least 50 atomic percent of at least one of these metals, are preferably used as the reflective electrode. When other metals are used, the benefits of luminance output increase and color quality improvement due to microcavity effect are much reduced. Similarly, for the semitransparent electrode only a small number of materials including Ag, Au, or alloys thereof are preferably used. The thickness range of the semitransparent electrode is also limited. Too thin a layer does not provide a significant microcavity effect and too thick a layer reduces the luminance output. In addition, the location of the light-emitting layer within the microcavity also strongly affects the luminance output and needs to be optimized. Only with a proper optimization of all these factors can a microcavity OLED device with emission output efficiency and color quality significantly improved over that of corresponding non-cavity OLED devices be achieved. The present inventors further discovered that an absorption-reduction layer disposed next to the semitransparent electrode layer outside the microcavity further improves the luminance performance of a microcavity device.

Metallic mirrors are simpler in structure and easier to fabricate than a QWS. The use of two metallic mirrors that also function as electrodes eliminates the need for a separate transparent conductive electrode. The sheet conductivity of the semitransparent metallic electrode can be much higher than the transparent conductive electrodes used in the prior art. The increased conductivity reduces Ohmic loss in an OLED device, especially if the device area is large. The emission bandwidths using appropriately designed metallic mirrors are broader than those obtained using QWS and hence the luminance output is increased. On the other hand, the emission bandwidth is still narrow enough to provide excellent color selectivity and color quality.

The metallic bottom-electrode layer can be the semitransparent one, in which case the organic light-emitting display in accordance with the present invention is bottom-emitting. Alternatively, the metallic top-electrode can be the semitransparent one, in which case the organic light-emitting display in accordance with the present invention is top-emitting. For the bottom-emitting display, the substrate is transparent to the emitted light from the device. The substrate can be made of glass, plastic, or other suitable transparent materials. For the top-emitting display, the substrate does not need to be transparent to the emitted light and can be made of metallic, ceramic, or other suitable substances.

The metallic bottom-electrode can be the anode and the metallic top-electrode can be the cathode. Alternatively, the metallic bottom-electrode can be the cathode and the metallic top-electrode can be the anode. In either case the organic EL element is appropriately orientated so that the hole-injection and hole transport layers are closer to the anode and the electron-injection and electron transport layers are closer to the cathode.

Since not all the preferred materials for the metallic electrodes provide good charge injection, the organic EL element preferably includes a hole-injection layer next to the HTL and/or an electron-injection layer next to the ETL. Suitable materials for use as the hole-injection layer include, but are not limited to, porphyrinic compounds as described in commonly-assigned U.S. Pat. No. 4,720,432, and plasma-deposited fluorocarbon polymers as described in commonly-assigned U.S. Pat. No. 6,208,075. Alternative hole-injection materials reportedly useful in organic EL devices are described in EP 0 891 121 A1 and EP 1 029 909 A1 and by Tokito et al. J. Phys. D. Vol 29 (1996) 2750. Electron-injection layers including those taught in U.S. Pat. Nos. 5,608,287; 5,776,622; 5,776,623; 6,137,223; and 6,140,763 disclosures of which are here incorporated by reference, can be employed. A thin-film containing low work-function alkaline metals or alkaline earth metals, such as Li, Cs, Ca, Mg can be employed. In addition, an organic material doped with these low work-function metals can also be used effectively as the electron-injection layer. Examples are Li- or Cs-doped Alq.

In some cases, materials used for the metal electrodes cause instability in an OLED device due to chemical interactions, electro-migration, or other causes. A suitable barrier layer can be used to prevent such instabilities. Again, the presence of a good electron or hole-injection layers allows a wide range of materials options for such a purpose.

The organic EL element has at least one light-emitting layer, but commonly it comprises several layers. An exemplary organic EL element can include a hole-injection layer, a hole transport layer, a light-emitting layer, an electron transport layer, and an electron-injection layer. The organic EL element can be based on small molecule OLED materials, or it can be based on polymer OLED materials. A device based on polymer OLED materials is often referred to as a PLED. The organic EL element can include florescent materials and it can also include phosphorescent materials.

To provide a full color display, a broadband organic EL element is used. A broadband organic EL element is one that has an emission spectrum that has adequate light output in the desired blue, green, and red regions of the visible wavelength range. Preferably, the broadband organic EL element has an emission spectrum that has peaks near the blue, the green, and the red wavelengths of the desired color output from the color organic light-emitting display device. Any of the many ways to achieve broadband emission reported in the prior art can be used for the present invention, including the use of multiple dopants in the emissive layer; the use of more than one emissive layer with different emission characteristics; and the use of dopants that have strong excimer emission (U.S. Pat. Nos. 5,683,823, 5,405,709; and JP 07,142,169).

In accordance with the present invention, different colored pixels are accomplished by providing a different microcavity length to pixels in different color pixel sets. This can be accomplished by providing different thicknesses of the transparent conductive phase-layers. A common un-patterned organic EL element and a common top-electrode layer can then be used over all pixels to complete the fabrication of the display, which greatly simplifies the organic light-emitting display fabrication process. The transparent conductive phase-layer needs to be transparent to the emitted light and it needs to be conductive to carry the charge carriers between the metallic bottom-electrode layer and the organic EL element. Since only through-film conductance is important, a bulk resistivity of less than about $10^7$ ohm-cm is adequate. Many metal oxides such as indium-tin oxide (ITO), zinc-tin oxide (ZTO), tin-oxide(SnOx), indium oxide (InOx), molybdnum oxide (MoOx), tellurium oxide (TeOx), antimony oxide (SbOx), and zinc oxide (ZnOx), vanadium oxide (VOx), and organic materials such as copper pthalothianine can be used. Another convenient option is to use the electron or hole transport layers commonly used in organic EL elements. For example, in cases where the metallic bottom-electrode is the anode, the different colored pixels can be pre-deposited with a different thickness of the hole transport layer. Then a common thickness of an additional hole transport layer is applied to all pixels to complete the OLED device construction. Similarly, in cases where the metallic bottom-electrode is a cathode, the electron transport layer can be used as the transparent conductive phase-layer.

If a material other than the electron or hole transport layer is used as the transparent conductive phase-layer between the metallic bottom-electrode and the organic EL element, it may be beneficial to include an electron-injection layer between the transparent conductive phase-layer and the organic EL element if the metallic bottom-electrode is the cathode; or to include a hole-injection layer between the transparent conductive phase-layer and the organic EL element if the metallic bottom-electrode is the anode. The useable electron-injection and hole-injection materials are the same as those described earlier.

In a preferred embodiment of the present invention, a first transparent conductive phase-layer of a predetermined thickness is disposed by common thin-film deposition techniques such as sputtering or evaporation over substantially the entire substrate. It is then patterned using conventional photo-lithographic techniques to leave the first transparent conductive phase-layer film only in pixels designed to receive such layer. A second transparent conductive phase-layer is then applied by conventional thin-film deposition methods over substantially the entire organic light-emitting display. The second transparent conductive phase-layer is then patterned using conventional photo-lithographic techniques to leave the second transparent conductive phase-layer only in pixels designed to receive such layer and in pixels designed to received both the first and second transparent conductive phase-layers. This process can be repeated so that pixels can have several different thickness of the transparent conductive phase-layer. By having two transparent conductive phase-layers, three different pixels can be produced, one of them having zero thickness of the transparent conductive phase-layer, another one having only the second transparent conductive phase-layer, and a third one having both the first and the second transparent conductive phase-layers. Alternatively, three different transparent conductive phase-layer thicknesses can be used to achieve the three color pixels.

Alternatively, the transparent conductive phase-layers can be prepared by conventional thin-film deposition techniques such as sputtering and evaporation through a shadow mask. The transparent conductive phase-layers can also be selectively disposed over the pixel areas by a laser or flash thermal transfer technique (U.S. Pat. Nos. 5,937,272; 5,904,961; and 5,688,551). In an exemplary thermal transfer process for the implementation of the present invention, there is provided a donor including a thin plastic sheet coated with an energy-absorbing layer on one of the surfaces. The material for the transparent conductive phase-layer to be transferred is disposed over the energy-absorbing layer. During the transfer process the donor is placed with the material for the transparent conductive phase-layer facing the metallic bottom-electrode layer. Radiant energy is then applied to the donor through the thin plastic sheet of the donor. The radiant energy is absorbed by the energy-absorbing layer causing the material for the transparent conductive phase-layer to reach an elevated temperature such that a substantial vapor of the transfer material is developed. The material for the transparent conductive phase-layer is thereby transferred to the patterned metallic bottom-electrode by evaporation-condensation of the vapor to form the transparent conductive phase-layer. Alternatively, the radiant energy causes the transfer material to reach an elevated temperature so that it becomes less viscous and flows to the metallic bottom-electrode. Different thicknesses of the transparent conductive phase-layer are achieved via the use of different donors. The patterning of the transparent conductive phase-layer can be achieved either by masking the radiant energy during the transfer process, or by using a scanning focused radiant energy beam, such as that from a high power laser, to selectively transfer portions of materials from the donor according to the desired pattern of the transparent conductive phase-layer.

The present invention can be applied to an active-matrix color organic light-emitting display in which a thin-film-transistors (TFT) structure is used in an active-addressing scheme (U.S. Pat. Nos. 5,684,365, and 5,550,066). In an active-matrix color organic light-emitting display, each pixel is provided with a number of thin-film transistors, other components such as capacitors, and a connecting pad that electrically contacts the metallic bottom-electrode.

The metallic bottom-electrode layer is disposed over the connecting pads on the TFT structure and patterned to define the pixels. Common thin-film deposition techniques such as sputtering, electron-beam evaporation, or resistive heat evaporation, etc. can be used for the preparation of the metallic bottom-electrode layer. The size and shape of the pixels are defined by the size and shape of the metallic bottom-electrodes. Patterning can be done using conventional photo-lithography or can be done by using shadow masks during the layer deposition process. Since photo-lithographic methods can be used to define the size and shape of the metallic bottom-electrode, the aperture ratio (the ratio of the active light-emitting area to the total display area) can be very high. Furthermore, the size and shape need not be identical for all pixels. In fact the size and shape of the pixels can be used as a tool to improve the image quality of the color organic light-emitting display.

The present invention can also be implemented in a passive-matrix color organic light-emitting display device.

In a passive-matrix color organic light-emitting display device, both the metallic top-electrode and the metallic bottom-electrode are patterned. The pixels are defined as the intersects between the metallic bottom-electrode and the metallic top-electrode. Each pixel is designed to be a microcavity tuned to emit the particular color light.

Figure 3A:
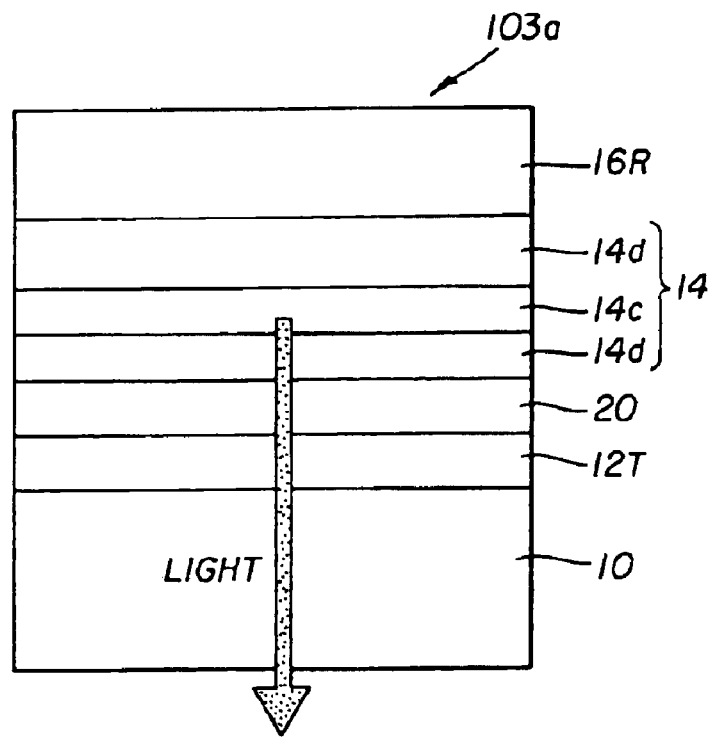
FIG. 3a is a schematic cross-sectional view of a bottom-emitting microcavity OLED device according to the present invention using all Ag electrodes.

FIG. 3a illustrates schematically the cross-sectional view of a microcavity OLED device 103a that represents a single pixel in a color organic light-emitting display device according to the present invention. Microcavity OLED device 103a includes a substrate 10, a semitransparent metallic bottom-electrode 12T, a transparent conductive phase-layer 20, an organic EL element 14, and a reflective metallic top-electrode 16R. Not shown in FIG. 3a are other possible features such as a TFT circuit structure that could exist on substrate 10 underneath semitransparent metallic bottom-electrode 12T and protective overcoat or encapsulation structures that could exist over the reflective metallic top-electrode 16R. The two metallic electrodes function as the reflective mirrors of the microcavity. Since the generated light emits through the semitransparent metallic bottom-electrode 12T and the substrate, substrate 10 needs to be transparent, and can be selected from glass or plastic. The reflective metallic top-electrode 16R is selected from Ag, Au, Al or alloys thereof, and the semitransparent metallic bottom-electrode 12T is selected from Ag, Au, or alloys thereof. The thickness of the reflective metallic top-electrode 16R is selected to have an optical density of 1.5 or larger so that it is essentially opaque and reflective. The thickness of the semitransparent bottom-electrode 12T is selected to improve the luminance light output at a predetermined wavelength from the microcavity OLED device 103a. The preferred thickness depends on the materials selected to be the anode and the cathode. The organic EL element 14 includes at least a light-emitting layer 14c, and may include one or more additional layer such as hole-injection layer 14a (not shown), hole transport layer 14b, electron transport layer 14d, and electron-injection layer 14e (not shown). In the order shown in FIG. 3a the semitransparent metallic bottom-electrode 12T is the anode and the reflective metallic top-electrode 16R is the cathode. The combined thickness of transparent conductive phase-layer 20 and organic EL element 14 is selected to tune the microcavity OLED device 103a to have the resonance at the predetermined wavelength to be emitted from the pixel. The thickness satisfies the following equation:

$$2\Sigma n_i L_i + 2 n_s L_s + (Q_{m1} + Q_{m2})\lambda/2\pi = m\lambda \qquad \text{Eq. 1,}$$

wherein $n_i$ is the index of refraction and $L_i$ is the thickness of the ith sub-layer in organic EL element 14; $n_s$ is the index of refraction and $L_s$ is the thickness, which can be zero, of transparent conductive phase-layer 20; $Q_{m1}$ and $Q_{m2}$ are the phase shifts in radians at the two organic EL element-metal electrode interfaces, respectively; $\lambda$ is the predetermined wavelength to be emitted from the device, and m is a non-negative integer. For ease-of-manufacturing considerations and for color purity, it is preferred to have m equal to 1 for the blue pixels, 0 or 1 for the green and red pixels.

The total thickness between the metal electrodes is the most important factor in determining the microcavity resonance wavelength. However, the resonance wavelength and more particularly the strength of the resonance (and thus the resulting efficiency of the device) also depend on the distance between the light-emitting layer 14c and each of the two electrodes. In particular, for optimal device performance, the distance between the reflective metallic top-electrode 16R and (the center of) the light-emitting layer 14c should roughly satisfy the following equation:

$$2\Sigma n_i L_i + Q_{m1} \lambda/2\pi = m_D \lambda \qquad \text{Eq. 2,}$$

wherein $n_i$ is the index of refraction and $L_i$ is the thickness of the ith sub-layer in organic EL element 14, $Q_{m1}$ is the phase shift in radians at the organic EL element-metal cathode interface, $\lambda$ is the predetermined wavelength to be emitted from the device, and $m_D$ a non-negative integer. Note that, in contrast to Eq. 1, the sum here is only over those layers that lie between (the center of) the emitting layer and the reflective metallic top-electrode 16R. One could write an analogous equation for the distance between the semitransparent metallic bottom-electrode 12T and the light-emitting layer 14c. However, since satisfaction of Eqs. 1 and 2 guarantee the satisfaction of this third equation, it does not provide any additional constraint.

Since it is desirable that the absorption of light by the semitransparent metallic bottom-electrode 12T be as low as feasible, a useful addition (that will be illustrated further in the examples below) is a high index of refraction absorption-reduction layer 22 between the semitransparent metallic bottom-electrode 12T and substrate 10. The purpose of this absorption-reduction layer 22 is to reduce the electric field produced by the light wave (and thus the absorption of the light wave) within the semitransparent metallic bottom-electrode 12T itself. To a good approximation, this result is best accomplished by having the electric field of the light wave reflected back from the interface between this absorption-reduction layer 22 and substrate 10 interfere destructively with, and thus partly cancel, the electric field of the light passing out of the device. Elementary optical considerations then imply that this will occur (for an absorption-reduction layer 22 having a higher index of refraction than the substrate 10) when the following equation is approximately satisfied:

$$2n_A L_A + n_T L_T = (m_A + \tfrac{1}{2})\lambda \qquad \text{Eq. 3,}$$

where $n_A$ and $L_A$ are the index of refraction and the thickness of absorption-reduction layer 22 respectively, $n_T$ and $L_T$ are the real part of the index of refraction and the thickness of semitransparent metallic bottom-electrode 12T respectively, and $m_A$ is a non-negative integer. It is preferred to have $m_A$ as small as practical, usually 0 and typically less than 2. The beneficial effects of the absorption-reduction layer is generally higher when higher index of refraction materials are used. For practical applications, an index of refraction value of 1.6 or higher is preferred.

In an alternate configuration of the device, the semitransparent metallic bottom-electrode 12T can be the cathode and the reflective metallic top-electrode 16R can be the anode. In such a case the organic EL element 14 is appropriately orientated so that the hole-injection and hole transport layers are closer to the anode and the electron-injection and electron transport layers are closer to the cathode.

Whereas the above discussions are based on a bottom-emitting OLED device, similar considerations and equations, with proper modifications, apply to a top-emitting device as well.

The effectiveness of the present invention in utilizing the all-metallic microcavity to enhance the OLED device output and in utilizing all-metallic microcavity for pixelation is illustrated in the following examples. In the examples based on theoretical prediction, the electroluminescence (EL) spectrum produced by a given device is predicted using an optical model that solves Maxwell's Equations for emitting dipoles of random orientation in a planar multilayer device [O. H. Crawford, J. Chem. Phys. 89, 6017 (1988); K. B. Kahen, Appl. Phys. Lett. 78, 1649 (2001)]. The dipole emission spectrum is assumed to be independent of wavelength in many cases so that the microcavity property itself can be investigated. In other cases the dipole emission spectrum is assumed to be given by the measured photoluminescence (PL) spectrum of the emitter material, incorporating a small blue shift of a few nanometers. This emission is assumed to occur uniformly in the first 10 nm of the emitting layer bordering the hole transport layer. For each layer, the model uses wavelength-dependent complex refractive indices that are either measured by spectroscopic ellipsometry or taken from the literature [Handbook of Optical Constants of Solids, ed. by E. D. Palik (Academic Press, 1985); Handbook of Optical Constants of Solids II, ed. by E. D. Palik (Academic Press, 1991); CRC Handbook of Chemistry and Physics, 83rd ed., edited by D. R. Lide (CRC Press, Boca Raton, 2002)]. Once the EL spectrum has been derived, it is straightforward to compute the luminance (up to a constant factor) and the CIE chromaticities of this spectrum. Numerous comparisons between predicted EL spectra and measured EL spectra have confirmed that the model predictions are very accurate. For all the theoretical examples, the total luminance output integrated over the entire visible wavelength region from 340 nm to 780 nm is used as a figure-of-merit to compare different device configurations. This luminance value is a convenient and reliable proxy of the emission output efficiency value that the present invention is aiming at improving. The luminance value actually underestimates the benefit of the microcavity as it includes the contribution of light outside of the wavelength region of interest. This extra light constitutes a larger fraction of the output of a non-microcavity device versus a microcavity device because of the larger emission bandwidth for the non-microcavity device.

EXAMPLE 1

Example 1 compares the theoretically predicted luminance output of a bottom emitting microcavity OLED device 103a as shown in FIG. 3a in accordance with the present invention against two comparative devices:

(a) an OLED device 103b without a microcavity, and (b) a microcavity OLED device 103c using a QWS as one of the mirrors for the microcavity.

Figure 3B:
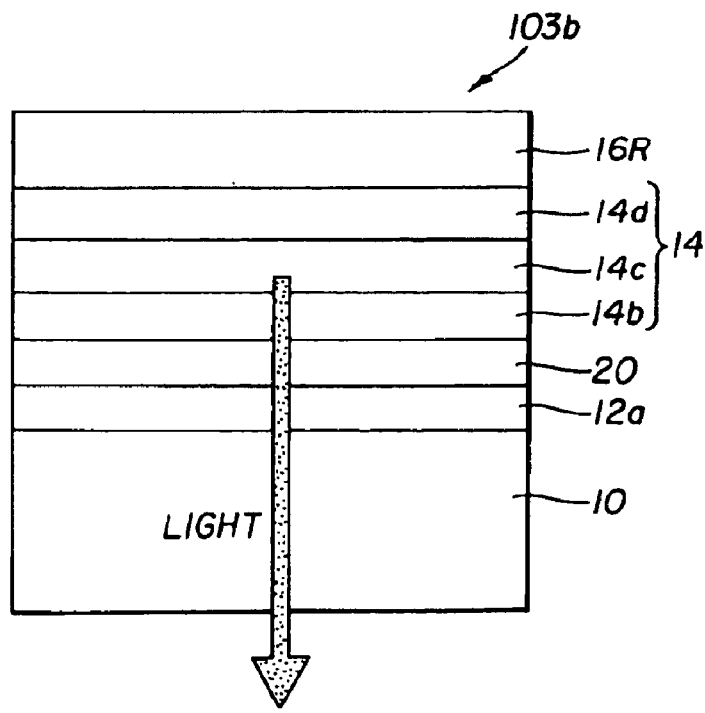
FIG. 3b is a schematic cross-sectional view of a bottom-emitting OLED device without microcavity.

OLED device 103b shown in FIG. 3b was similar in construction to microcavity OLED device 103a except that the semitransparent metallic bottom-electrode 12T which was an Ag anode was replaced by an ITO transparent bottom-electrode 12a. This device represents an OLED device without microcavity, although there is always some optical interference effect in a multi-layer device.

Figure 3C:
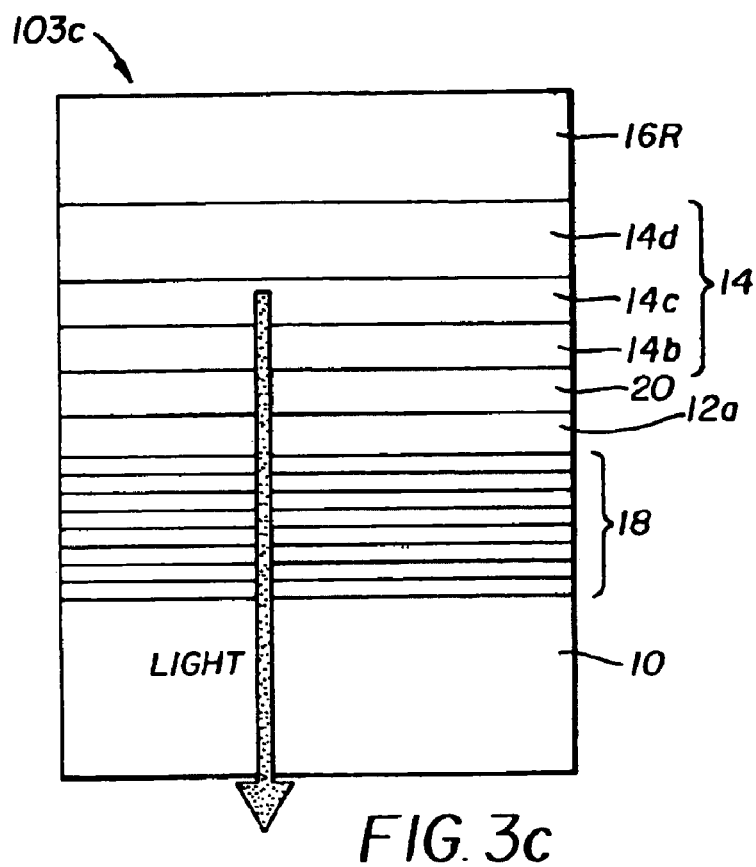
FIG. 3c is a schematic cross-sectional view of a bottom-emitting microcavity OLED device based on a QWS.

Microcavity OLED device 103c shown in FIG. 3c was similar in construction to OLED device 103b except that a QWS reflecting mirror 18 was disposed between substrate 10 and ITO transparent bottom-electrode 12a. The QWS reflecting mirror 18 was of the form $TiO_2:SiO_2:TiO_2:SiO_2:TiO_2$ with $TiO_2$ n=2.45 and $SiO_2$ n=1.5. The thickness of each material was 56 nm for $TiO_2$ and 92 nm for $SiO_2$ [as in R. H. Jordan et al., Appl. Phys. Lett. 69, 1997 (1996)]. This device represents a typical QWS based microcavity OLED device.

For all three devices substrate 10 was glass. Reflective metallic top-electrode 16R was a 400 nm Ag layer. The organic EL element 14 was assumed to include a NPB hole transport layer 14b, a 10 nm light-emitting layer 14c, and an Alq electron transport layer 14d. The light-emitting layer 14c was assumed to have an output that is independent of wavelength. This assumption was to facilitate the evaluation of the microcavity property itself independent of the specific properties of the emitter so that the conclusion can be applied generically to any emitters. The use of a wavelength-independent emitter, however, under-estimates the beneficial effect of the microcavity. The thickness of the transparent conductive phase-layer 20 was assumed to be zero for all three devices. The thickness of all the layers was optimized to achieve maximum luminance output from each device. The luminance output was integrated over the entire visible wavelength range from 380 nm to 780 nm.

The calculated results are summarized in Table 1. These results showed that microcavity OLED device 103c using a QWS as a semitransparent mirror indeed enhanced the luminance output and narrowed the emission bandwidth (full-width-half-max FWHM) when compared with the OLED device 103b without microcavity. The luminance value improved from 0.239 (arbitrary units) to 0.385. Microcavity OLED device 103a using all Ag mirrors, however, showed surprisingly better luminance output, 0.425, even though the peak luminance height was more than a factor of two lower than that of microcavity OLED device 103c. The emission bandwidth of the all-Ag microcavity OLED device 103a was much larger than OLED device 103c with a QWS, but it was still small enough to yield good color purity.

EXAMPLE 3

Example 3 compares the theoretically predicted luminance output of a top-emitting microcavity OLED device 104a in accordance with the present invention against two comparative devices:

(a) an OLED device 104b without a microcavity, and (b) a microcavity OLED device 104c using a QWS as one of the reflecting mirrors for the microcavity.

Figure 4A:
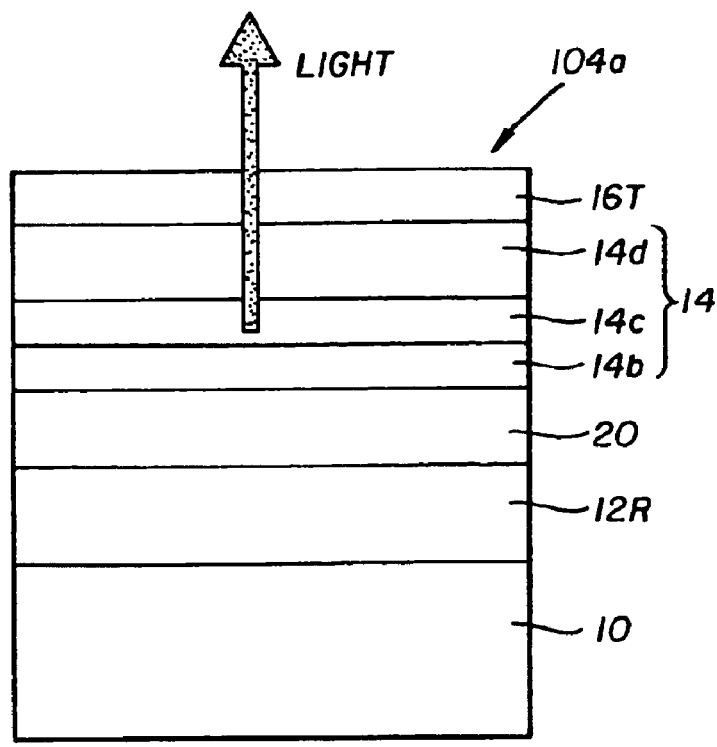
FIG. 4a is a schematic cross-sectional view of a top-emitting microcavity OLED device according to the present invention using all Ag electrodes.

FIG. 4a illustrates schematically the cross-sectional view of an exemplary top-emitting microcavity OLED device 104a according to the present invention. Microcavity OLED device 104a included a glass substrate 10, a Ag reflective metallic bottom-electrode 12R, a transparent conductive phase-layer 20, an organic EL element 14, and an Ag semitransparent metallic top-electrode 16T.

Figure 4B:
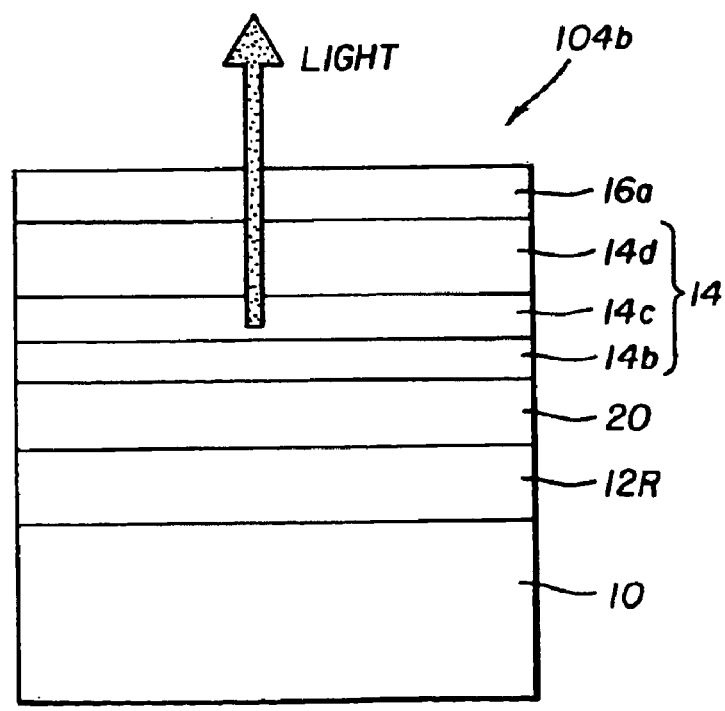
FIG. 4b is a schematic cross-sectional view of a top-emitting OLED device without microcavity.

OLED device 104b shown in FIG. 4b was similar in construction to microcavity OLED device 104a except that

TABLE 1

| Device | Description | Substrate | QWS | Anode (ITO) nm | Anode (Ag) nm | NPB nm | Flat Band Emitter nm | Alq nm | Cathode (Ag) nm | Luminance arbitrary | Peak location nm | height arbitrary | FWHM nm |
|---|---|---|---|---|---|---|---|---|---|---|---|---|---|
| 103b | no cavity | Glass | | 100.7 | | 43.1 | 10 | 53.1 | 400 | 0.239 | 547 | 2.4 | N.A. |
| 103c | QWS | Glass | yes | 50.0 | | 26.6 | 10 | 54.9 | 400 | 0.385 | 564 | 16.8 | 17 |
| 103a | all Ag | Glass | | | 17.5 | 45.9 | 10 | 54.3 | 400 | 0.425 | 567 | 6.6 | 73 |

EXAMPLE 2

Example 2 is a demonstration of the benefit of the absorption-reduction layer 22 for a bottom emitting device.

Figure 3D:
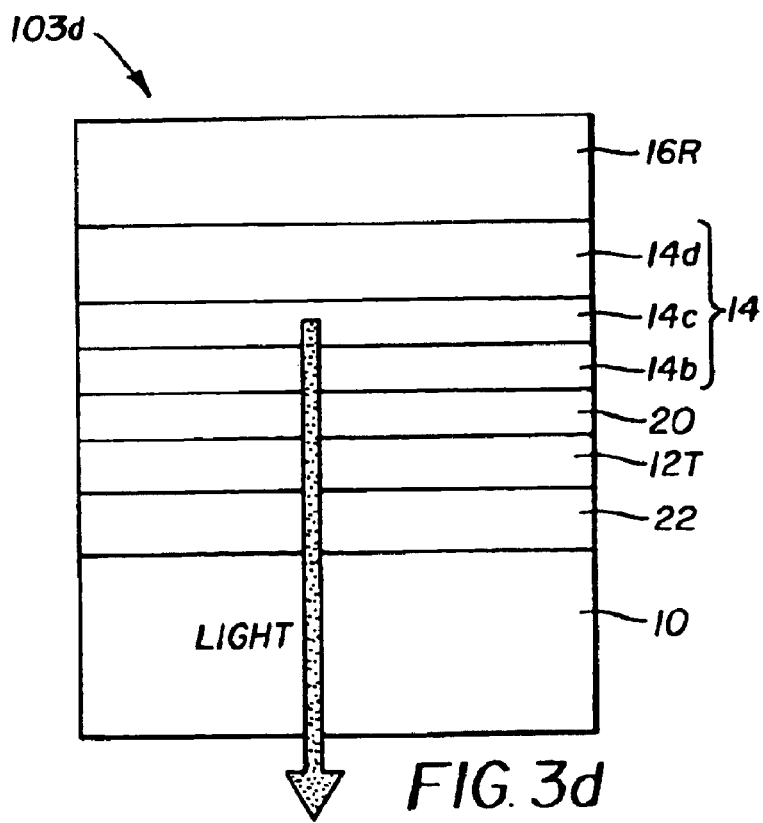
FIG. 3d is a schematic cross-sectional view of a bottom-emitting microcavity OLED with an absorption-reduction layer according to the present invention.

FIG. 3d illustrates schematically the cross-sectional view of a bottom emitting microcavity OLED device 103d. Microcavity OLED device 103d was similar in structure to microcavity OLED device 103a except an absorption-reduction layer 22 was disposed between substrate 10 and semitransparent metallic bottom-electrode 12T. For this example, ITO was selected as the absorption-reduction layer 22. The calculations showed that the effectiveness of the absorption-reduction layer 22 in enhancing luminance output would improve if a higher index of refraction material was used. As will be apparent from Example 4, luminance output could also be increased if the absorption-reduction layer 22 were in direct contact with air rather than with glass. The thickness of all layers was optimized as in Example 1. The results of the calculation are summarized in Table 2. It can be seen that the insertion of absorption-reduction layer 22 increased the luminance output of the all Ag microcavity OLED device 103a from about 0.425 to about 0.453.

the Ag semitransparent metallic top-electrode 16T was replaced by an ITO transparent top-electrode 16a which we required to have a thickness of at least 50 nm. Because there was only one reflecting mirror in the device, OLED device 104b represents an OLED device without a microcavity, although there is always some optical interference effect in a multi-layer device, particularly at the interface between the ITO cathode and the air.

Figure 4C:
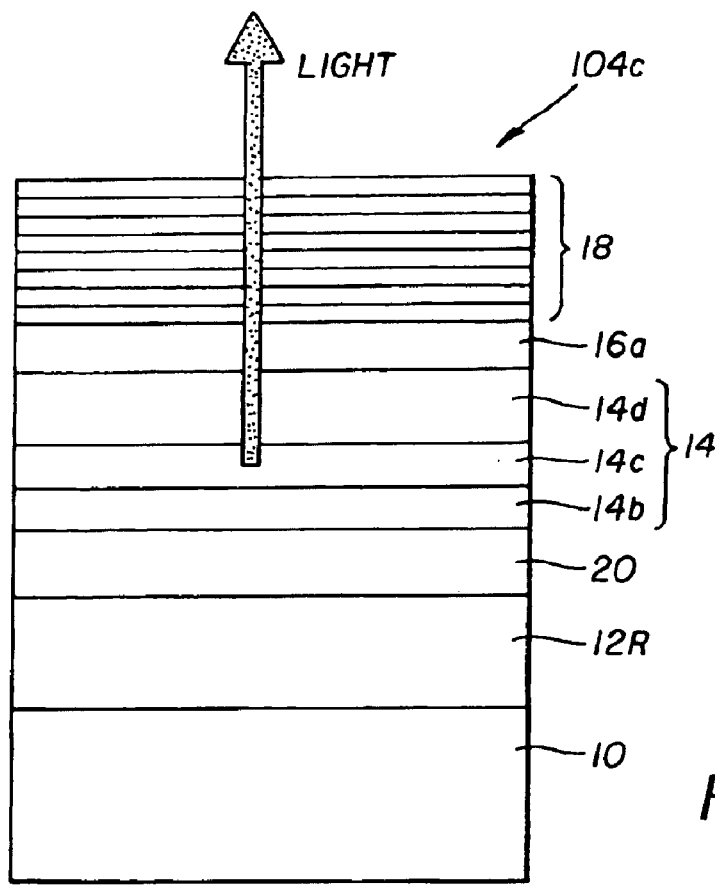
FIG. 4c is a schematic cross-sectional view of a top-emitting microcavity OLED device based on a QWS.

OLED device 104c shown in FIG. 4c was similar in construction to OLED device 104b except that a QWS reflecting mirror 18 was disposed on top of transparent top-electrode 16a which we required to have a thickness of at least 50 nm. The QWS reflecting mirror 18 was of the form $TiO_2:SiO_2:TiO_2:SiO_2:TiO_2$ with $TiO_2$ n=2.45 and $SiO_2$ n=1.5. Thickness of each materials is 56 nm for $TiO_2$ and 92 nm for $SiO_2$ [as in R. H. Jordan et al., Appl. Phys. Lett. 69, 1997 (1996)]. This device represents a typical QWS based microcavity OLED device.

For all three devices the reflective metallic bottom-electrode 12R was a 400 nm Ag layer. The organic EL element 14 was assumed to include a NPB hole transport layer 14b, a 10 nm light-emitting layer 14c, and an Alq

TABLE 2

| Device | Description | Substrate | Absorption-reduction (ITO) nm | Anode (Ag) nm | NPB nm | Flat Band Emitter nm | Alq nm | Cathode (Ag) nm | Luminance arbitrary | Peak Location nm | Height arbitrary | FWHM nm |
|---|---|---|---|---|---|---|---|---|---|---|---|---|
| 103a | Without absorption-reduction | Glass | | 17.5 | 45.9 | 10 | 54.3 | 400 | 0.425 | 567 | 6.6 | 73 |
| 103d | With absorption-reduction | Glass | 82.2 | 18.5 | 48.1 | 10 | 54.3 | 400 | 0.453 | 565 | 7.0 | 75 | electron transport layer 14d. The light-emitting layer 14c was assumed to have an output that was independent of wavelength. This assumption is to facilitate the evaluation of the microcavity property itself independent of the specific properties of the emitter so that the conclusion can be applied generically to any emitters. The transparent conductive phase-layer 20 was made of ITO. The thickness of all the layers was optimized to achieve maximum luminance output from each device. The luminance output was integrated over the entire visible wavelength range from 380 nm to 780 nm.

over the semitransparent metallic top-electrode 16T. For this example, ZnS:20%SiO$_2$ (n=2.15, k=0.003) was selected as the material for the exemplary absorption-reduction layer 22. The calculations showed that the effectiveness of the absorption-reduction layer in enhancing luminance output would improve if a higher index of refraction material were used. The thickness of all layers was optimized as in Example 1. The results of the calculation are summarized in Table 4. It can be seen that the insertion of absorption-reduction layer 22 increased the luminance output of the microcavity OLED device from about 0.411 to about 0.504.

TABLE 3

| Device | Anode Ag | ITO nm | NPB nm | Flat Band Emitter nm | Alq nm | cathode material | cathode nm | Luminance Arbitrary | Peak Location nm | Peak Ht. Arbitrary | FWHM nm |
|---|---|---|---|---|---|---|---|---|---|---|---|
| 104b | 400 | 19.7 | 30 | 10 | 67.0 | ITO | 86.8 | 0.318 | 555 | 3.8 | 141 |
| 104c | 400 | 23.1 | 30 | 10 | 29.8 | ITO + QWS | 50 | 0.335 | 568 | 19.4 | 13 |
| 104a | 400 | 20.2 | 30 | 10 | 44.6 | Ag | 13.7 | 0.411 | 568 | 6.2 | 75 |

Table 3 shows the calculated characteristics of the three devices. Microcavity OLED device 104c using a QWS as one of its reflecting mirrors did show a very strong microcavity effect. The luminance peak height was greatly increased to 19.4 (arbitrary units) as compared with a value In addition, the thickness of the optimum semitransparent Ag cathode layer is increased from 13.7 nm to 20.3 nm. The increased Ag thickness is beneficial since it increases greatly the electrical conductivity of the semitransparent electrode layer.

TABLE 4

| Device | Anode Ag | ITO nm | NPB nm | Alq nm | cathode material | cathode nm | ZnS:SiO2 nm | Luminance Arbitrary | Peak Location nm | Peak Ht. Arbitrary | FWHM nm |
|---|---|---|---|---|---|---|---|---|---|---|---|
| 104a | 400 | 20.2 | 30 | 44.6 | Ag | 13.7 | 0 | 0.411 | 568 | 6.2 | 75 |
| 104d | 400 | 19.6 | 30 | 58.3 | Ag | 20.3 | 61.4 | 0.504 | 560 | 9.0 | 58 | of 3.8 for OLED device 104b without microcavity. Because of the much narrowed FWHM, however, the total luminance output was actually only modestly larger. If the minimum thickness of the ITO cathode were set to a larger value than 50 nm (say, 100 nm) in order to obtain the required electrical conductivity for the cathode, then the QWS is actually found to have a lower luminance than the device without the QWS because the cavity thickness for the QWS case cannot be optimized at the lowest order maximum. Microcavity OLED device 104a using Ag for both electrodes, on the other hand, showed a significant improvement in luminance output over the other two comparative devices.

EXAMPLE 4

Figure 4D:
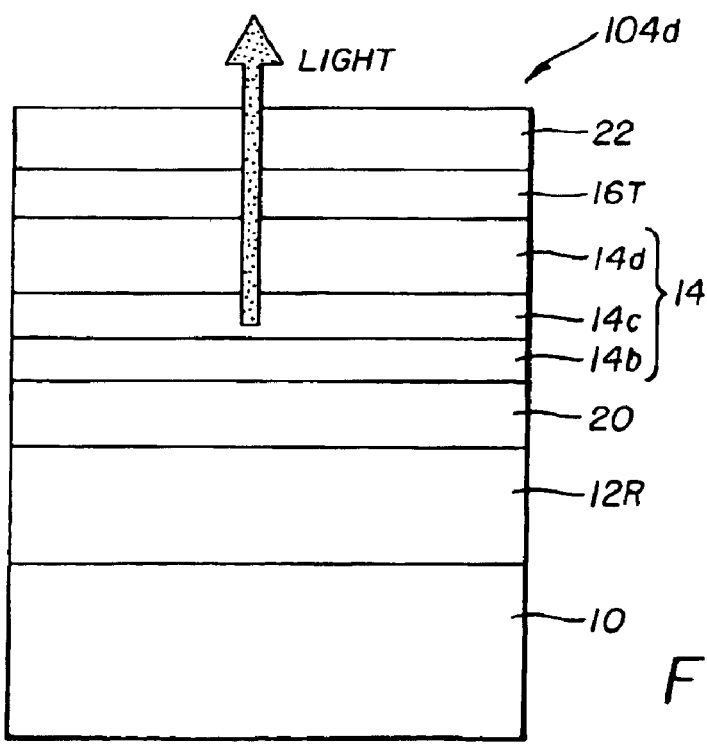
FIG. 4d is a schematic cross-sectional view of a top-emitting microcavity OLED with an absorption-reduction layer according to the present invention.

Example 4 is a demonstration of the benefit of the absorption-reduction layer. FIG. 4d illustrates schematically the cross-sectional view of a top-emitting microcavity OLED device 104d. Microcavity OLED device 104d was similar in structure to microcavity OLED device 104a except that an absorption-reduction layer 22 was disposed

EXAMPLE 5

Example 5 compares different materials for use as the reflective metallic electrode layer.

Table 5 shows the calculated luminance output of devices made according to FIG. 4d but using different materials for the reflective metallic bottom-electrode 12R. For all devices the semitransparent metallic top-electrode 16T was a thin Ag layer. The organic EL element 14 was assumed to include a NPB hole transport layer 14b, a 10 nm light-emitting layer 14c, and an Alq electron transport layer 14d. The light-emitting layer 14c was assumed to have an output that was independent of wavelength. This assumption is to facilitate the evaluation of the microcavity property itself independent of the specific properties of the emitter so that the conclusion can be applied generically to any emitters. An ITO layer was used as the transparent conductive phase-layer 20 and a ZnS:(20%)SiO$_2$ dielectric was used as the absorption-reduction layer 22. The thickness of all layers, except that of the NPB hole transport layer 14b, was optimized to give maximum luminance output. The thickness of the hole transport layer 14b was fixed at 30 nm for all devices.

TABLE 5

| Anode | ITO nm | NPB nm | Emitter nm | Alq nm | cathode material | cathode nm | ZnS:SiO2 nm | Luminance Arbitrary | Peak λ nm | Peak Ht. Arbitrary | FWHM nm |
|---|---|---|---|---|---|---|---|---|---|---|---|
| Ag | 19.6 | 30 | 10 | 58.3 | Ag | 20.3 | 61.4 | 0.504 | 560 | 9.0 | 58 |
| Al | 29.4 | 30 | 10 | 58.0 | Ag | 19.7 | 60.8 | 0.481 | 558 | 8.0 | 63 |
| Au | 16.2 | 30 | 10 | 60.8 | Ag | 19.0 | 63.8 | 0.435 | 558 | 7.7 | 70 |
| MgAg | 23.7 | 30 | 10 | 56.1 | Ag | 15.7 | 65.8 | 0.429 | 558 | 6.7 | 72 |
| Cu | 16.5 | 30 | 10 | 63.5 | Ag | 14.5 | 62.3 | 0.310 | 593 | 4.9 | 96 |
| Cr | 29.2 | 30 | 10 | 62.7 | Ag | 10.0 | 60.6 | 0.239 | 555 | 2.8 | 160 |
| Mo | 29.8 | 30 | 10 | 71.8 | Ag | 0 | 71.3 | 0.199 | 565 | 2.2 | 186 |
| Zr | 7.9 | 30 | 10 | 10.0 | Ag | 0 | 0 | 0.096 | 588 | 0.9 | N.A. |

Table 5 shows the calculated characteristics of devices made using different reflective anode materials. The selection of anode material had a drastic effect on the luminance efficiency of the devices. There appears to be a direct correlation between the reflectivity of the anode material and the luminance output. There was over a factor of five difference in luminance output between the lowest reflectivity Zr anode and the highest reflectivity Ag anode. For the lowest reflectivity anodes such as Mo or Zr, the optimum luminance was obtained when there was no semitransparent cathode. The FWHM was very large and there was little luminance enhancement over the non-cavity baseline value of 0.318 unless Ag, Al, Au and MgAg was used as the anode.

EXAMPLE 6

Example 6 demonstrates the effect of different metallic semitransparent electrode materials on device performance.

Table 6 shows the calculated luminance output of devices made according to FIG. 4a but using different materials for the semitransparent metallic top-electrode 16T which was the cathode for the devices. For all devices the reflective metallic bottom-electrode 12R was a 400 nm Ag layer. The organic EL element 14 was assumed to include a NPB hole transport layer 14b, a 10 nm light-emitting layer 14c, and an Alq electron transport layer 14d. The light-emitting layer 14c was assumed to have an output that was independent of wavelength. This assumption is to facilitate the evaluation of the microcavity property itself independent of the specific properties of the emitter so that the conclusion can be applied generically to any emitters. An ITO layer was used as the transparent conductive phase-layer 20 and no absorption-reduction layer 22 was used. The thickness of all layers, except that of the NPB hole transport layer 14b, was optimized to give maximum luminance output. The thickness of the hole transport layer 14b was fixed at 30 nm for all devices and the thickness of electron transport layer 14d was restricted to be 20 nm or larger. Without the latter restriction the optimization algorithm selects an unrealistically small thickness for the electron transport layer 14d.

TABLE 6a

| Anode | ITO transparent conductive phase-layer nm | NPB Thickness nm | Emitter Thickness nm | Alq Thickness nm | Cathode | Cathode Thickness nm | Luminance a. u. | Peak Wavelength nm | Peak Height a. u. | FWHM nm |
|---|---|---|---|---|---|---|---|---|---|---|
| Ag | 20.2 | 30 | 10 | 44.6 | Ag | 13.7 | 0.411 | 567.5 | 6.2 | 75 |
| Ag | 21.5 | 30 | 10 | 44.5 | Au | 21.3 | 0.385 | 582.5 | 5.9 | 94 |
| Ag | 11.4 | 30 | 10 | 20.0 | MgAg | 0 | 0.345 | 567.5 | 3.4 | N.A. |
| Ag | 11.4 | 30 | 10 | 20.0 | Al | 0 | 0.345 | 567.5 | 3.4 | N.A. |
| Ag | 11.4 | 30 | 10 | 20.0 | Cu | 0 | 0.345 | 567.5 | 3.4 | N.A. |
| Ag | 11.4 | 30 | 10 | 20.0 | Cr | 0 | 0.345 | 567.5 | 3.4 | N.A. |
| Ag | 11.4 | 30 | 10 | 20.0 | Mo | 0 | 0.345 | 567.5 | 3.4 | N.A. |
| Ag | 11.4 | 30 | 10 | 20.0 | Zr | 0 | 0.345 | 567.5 | 3.4 | N.A. |

Table 6 shows that the selection of material for the semitransparent metallic top-electrode 16T had a significant impact on device performance. Only devices using Au and Ag as the semitransparent metallic top-electrode 16T showed microcavity enhancement effect. Using all other materials as cathode, the optimum performance was obtained when no cathode thickness was used. Of course this not a realistic case since a cathode is needed to complete the cell.

When an absorption-reduction layer 22 is used, more materials can be used as the semitransparent metallic top-electrode 16T. Table 6b shows the calculated luminance output of devices made similar to those for Table 6a, but with an absorption-reduction layer 22 of ZnS:(20%)SiO$_2$ added over the semitransparent metallic top-electrode 16T. For all devices the reflective metallic bottom-electrode 12R was a 400 nm Ag layer. The organic EL element 14 was assumed to include a NPB hole transport layer 14b, a 10 nm light-emitting layer 14c, and an Alq electron transport layer 14d. The light-emitting layer 14c was assumed to have an output that was independent of wavelength. This assumption is to facilitate the evaluation of the microcavity property itself independent of the specific properties of the emitter so that the conclusion can be applied generically to any emitters. An ITO layer was used as the transparent conductive phase-layer 20 and a ZnS:(20%)SiO$_2$ dielectric layer was used as the absorption-reduction layer 22. The thickness of all layers, except that of the NPB hole transport layer 14b, was optimized to give maximum luminance output. The thickness of the hole transport layer 14b was fixed at 30 nm for all devices. The MgAg alloy was a 90% Mg:10% Ag alloy commonly used for OLED applications. It is expected that other MgAg alloys with less than 50% Ag will show similar behavior.

TABLE 6b

| Anode | ITO nm | NPB nm | Emitter nm | Alq nm | cathode material | cathode nm | ZnS:SiO$_2$ nm | Luminance Arbitrary | Peak λ nm | Peak Ht. Arbitrary | FWHM nm |
|---|---|---|---|---|---|---|---|---|---|---|---|
| Ag | 19.6 | 30 | 10 | 58.3 | Ag | 20.3 | 61.4 | 0.504 | 560 | 9 | 58 |
| Ag | 19.9 | 30 | 10 | 56.5 | Au | 21.5 | 62.7 | 0.486 | 565 | 8.3 | 62 |
| Ag | 20.4 | 30 | 10 | 60.1 | MgAg | 12.3 | 67.2 | 0.470 | 558 | 7.3 | 66 |
| Ag | 19.5 | 30 | 10 | 65.0 | Al | 5.5 | 69.1 | 0.440 | 558 | 7.3 | 63 |
| Ag | 18.9 | 30 | 10 | 63.8 | Cu | 14.7 | 64.0 | 0.418 | 565 | 5.9 | 95 |
| Ag | 19.6 | 30 | 10 | 77.3 | Cr | 0 | 64.9 | 0.396 | 560 | 5.3 | 101 |
| Ag | 19.6 | 30 | 10 | 77.3 | Mo | 0 | 64.9 | 0.396 | 560 | 5.3 | 101 |
| Ag | 19.6 | 30 | 10 | 77.3 | Zr | 0 | 64.9 | 0.396 | 560 | 5.3 | 101 |
| Ag | 23.1 | 30 | 10 | 29.8 | ITO + QWS | 50.0 | | 0.335 | 568 | 19.4 | 13 |

Table 6b shows that the selection of material for the semitransparent metallic top-electrode 16T broadens with the presence of the absorption-reduction layer. Materials include Al, Cu, alloys thereof, or MgAg alloys with less than 50% Ag can be used to produce the beneficial microcavity effect. Again the higher reflectivity metals such as Ag, Au, MgAg, and Al showed the best results, but the correlation with reflectivity is not as strong since the higher reflectivity Al gave worse results than Au and MgAg. (This is understood to be due to the fact that the optical absorbance of the metal is also an important parameter for the semitransparent electrode. Al has a particularly large imaginary part of its index of refraction and thus a high absorbance.) Also included in the study was a microcavity OLED device using a QWS as the semitransparent mirror. It actually yielded lower total luminance than all other materials investigated. The peak height was significantly higher than all other materials, but because of its extremely small FWHM, the luminance output was the smallest.

EXAMPLE 7a

Conventional OLED—Comparative

The preparation of a conventional non-microcavity OLED is as follows: A 1 mm thick glass substrate coated with a transparent ITO conductive layer was cleaned and dried using a commercial glass scrubber tool. The thickness of ITO is about 42 nm and the sheet resistance of the ITO is about 68 Ω/square. The ITO surface was subsequently treated with oxidative plasma to condition the surface as an anode. A 1 nm thick layer of CFx, polymerized fluorocarbon, was deposited on the clean ITO surface as the hole-injection layer by decomposing CHF$_3$ gas in RF plasma treatment chamber. The substrate was then transferred into a vacuum deposition chamber for deposition of all other layers on top of the substrate. The following layers were deposited in the following sequence by sublimation from a heated boat under a vacuum of approximately 10$^{-6}$ Torr:

(1) a hole transport layer, 65 nm thick, consisting of N,N'-di(naphthalene-1-yl)-N,N'-diphenyl-benzidine (NPB);

(2) an electron transport layer (also serving as the emissive layer), 75 nm thick, consisting of tris(8-hydroxyquinoline)aluminum(III) (Alq);

(3) an electron-injection layer, 1 nm thick, consisting of Li; and (4) a cathode, approximately 50 nm thick, consisting of Ag.

After the deposition of these layers, the device was transferred from the deposition chamber into a dry box for encapsulation. The completed device structure is denoted as Glass/ITO(42)/CFx(1)/NPB(65)/Alq(75)/Li(1)/Ag(50).

Figure 5:
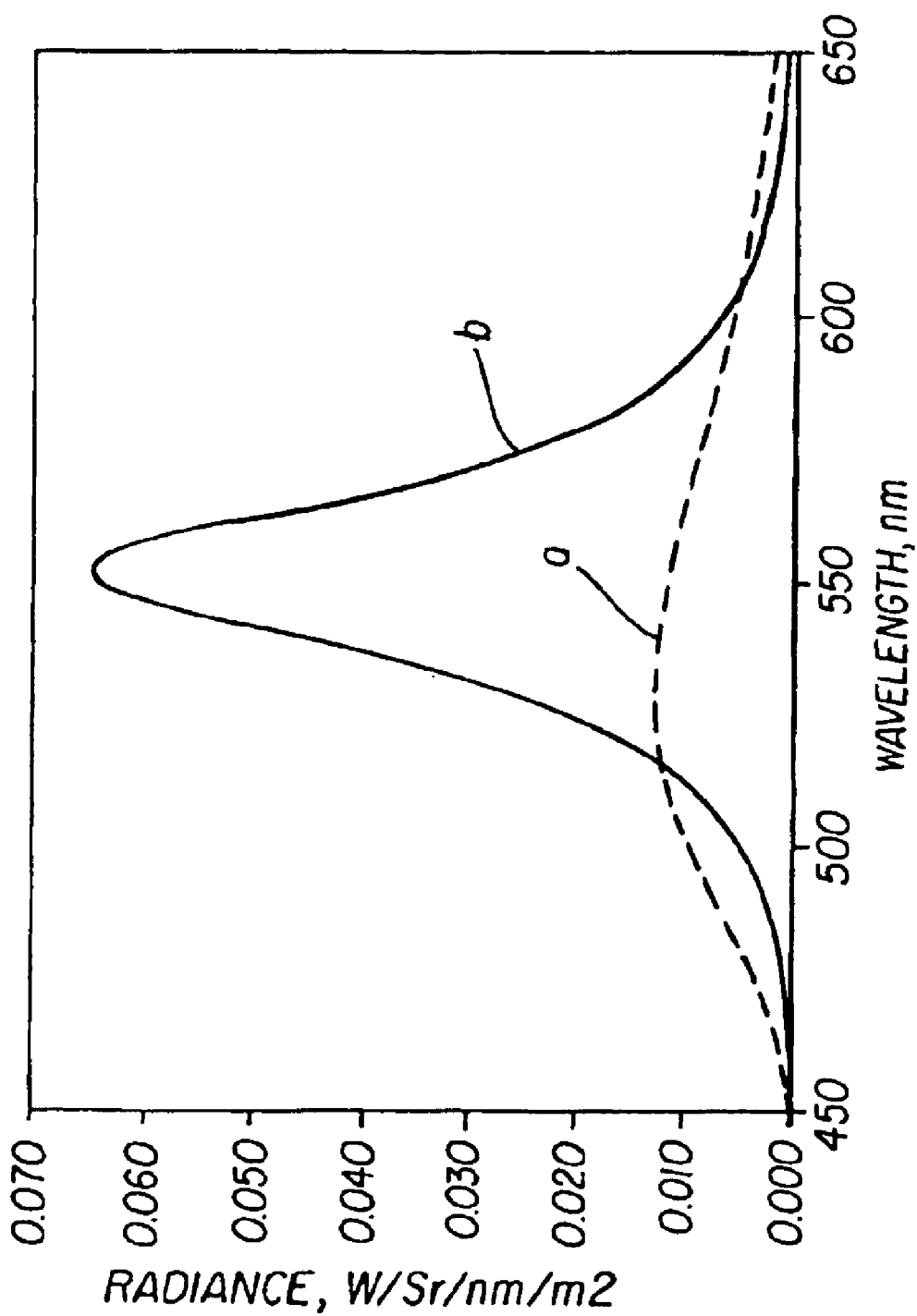
FIG. 5 shows the comparison of emission spectra between an OLED device without microcavity and a microcavity OLED device according to the present invention.

At 20 mA/cm$^2$, this device requires a driving voltage of 7.7 V, its emission output efficiency is 3.3 cd/A, the FWHM bandwidth is 104 nm, and the color coordinates are CIE-x=0.346, CIE-y=0.550. The emission spectrum at 20 mA/cm$^2$ is shown as curve-a in FIG. 5. The emission output efficiency measured around the peak emission wavelength of 552 nm is 0.68 W/Sr/m$^2$.

EXAMPLE 7b

Working Example

A microcavity OLED was fabricated as follows. A glass substrate was coated with an anode layer, 93 nm thick, consisting of Ag, by a DC sputtering process at an Ar pressure of about 4 mTorr. A 2 nm thick layer of MoOx, was deposited on the clean Ag surface as the hole-injection layer by evaporation. The following layers were deposited in the following sequence by sublimation from a heated boat under a vacuum of approximately 10$^{-6}$ Torr:

(1) a hole transport layer, 45 nm thick, consisting of N,N'-di(naphthalene-1-yl)-N,N'-diphenyl-benzidine (NPB);

(2) an electron transport layer (also serving as the emissive layer), 65 nm thick, consisting of tris(8-hydroxyquinoline)aluminum(III) (Alq);

(3) an electron-injection layer, 1 nm thick, consisting of Li;

(4) a cathode, approximately 22.5 nm thick, consisting of Ag; and (5) an absorption-reduction layer, approximately 85 nm thick, consisting of Alq.

After the deposition of these layers, the device was transferred from the deposition chamber into a dry box for encapsulation. The completed device structure is denoted as Glass/Ag(93)/MoOx(2)/NPB(45)/Alq(65)/Li(1)/Ag(22.5)/Alq(85).

At 20 mA/cm$^2$, this device requires a driving voltage of 7.0 Volts, its emission output efficiency is 9.3 cd/A, the FWHM bandwidth is 36 nm, and the color coordinates are CIE-x=0.351, CIE-y=0.626. The emission spectrum at 20 mA/cm$^2$ is shown as curve-b in FIG. 5. The emission output efficiency calculated around the peak wavelength of 552 nm is 2.48 W/Sr/m$^2$. Comparing with the results of comparative Example 7a, the microcavity device according to the present invention showed a significant improvement in emission output efficiency, a reduction in FWHM bandwidth, and a significant improvement in color.

It is also instructive to compare this experimental result with the theoretical prediction obtained from the optical model used to create examples 1 through 6. The actual gain in luminance output by a factor of 2.8 seen in this example is in very good agreement with the predicted factor of 2.57 that is obtained from optical modeling of these two structures. The change in the FWHM bandwidth and the change in the CIE color coordinates between these two structures is also predicted with a fair degree of accuracy by the optical model.

EXAMPLE 8

Example 8 demonstrates pixelation using an all-metallic microcavity. Four OLED devices were fabricated: Device #8-1 was a conventional non-microcavity OLED utilizing a broadband emitter in a bottom-emitting structure; device #8-2 was a top-emitting microcavity OLED device utilizing the same broadband emitter tuned to emit blue light; device #8-3 was a top-emitting microcavity OLED device utilizing the same broadband emitter tuned to emit green light; and device #8-4 was a top-emitting microcavity OLED device utilizing the same broadband emitter tuned to emit red light.

For device #8-1 a 1 mm thick glass substrate coated with a transparent ITO conductive layer was cleaned and dried using a commercial glass scrubber tool. The thickness of ITO is about 42 nm and the sheet resistance of the ITO is about 68 Ω/square. The ITO surface was subsequently treated with oxidative plasma to condition the surface as an anode. A 1 nm thick layer of CFx, polymerized fluorocarbon, was deposited on the clean ITO surface as the hole-injection layer by decomposing $CHF_3$ gas in RF plasma treatment chamber. The substrate was then transferred into a vacuum deposition chamber for deposition of all other layers on top of the substrate. The following layers were deposited in the following sequence by sublimation from a heated boat under a vacuum of approximately $10^{-6}$ Torr:

(1) an undoped hole transport layer, 86.7 nm thick, consisting of N,N'-di(naphthalene-1-yl)-N,N'-diphenyl-benzidine (NPB);
(2) a doped hole transport layer, 20 nm thick, consisting of N,N'-di(naphthalene-1-yl)-N,N'-diphenyl-benzidine (NPB) doped with 2.5% rubrene;
(3) a light-emitting layer, 30 nm thick, consisting of TBADN doped with 1.5% 4-(Di-p-Tolylamino)-4'-[(di-p-tolylamino)styryl]stilbene;
(4) an electron transport layer (also serving as the emissive layer), 32.1 nm thick, consisting of tris(8-hydroxyquinoline)aluminum(III) (Alq);
(5) an electron-injection layer, 1 nm thick, consisting of Li; and
(6) a cathode, approximately 50 nm thick, consisting of Ag.

After the deposition of these layers, the device was transferred from the deposition chamber into a dry box for encapsulation. The completed device structure is denoted as Glass/ITO(42)/CFx(1)/NPB(86.7)/NPB:2.5% rubrene(20)/TBADN: 1.5% 4-(Di-p-Tolylamino)-4'-[(di-p-tolylamino)styryl]stilbene (30)/Alq(32.1)/Li(1)/Ag(50).

Figure 6:
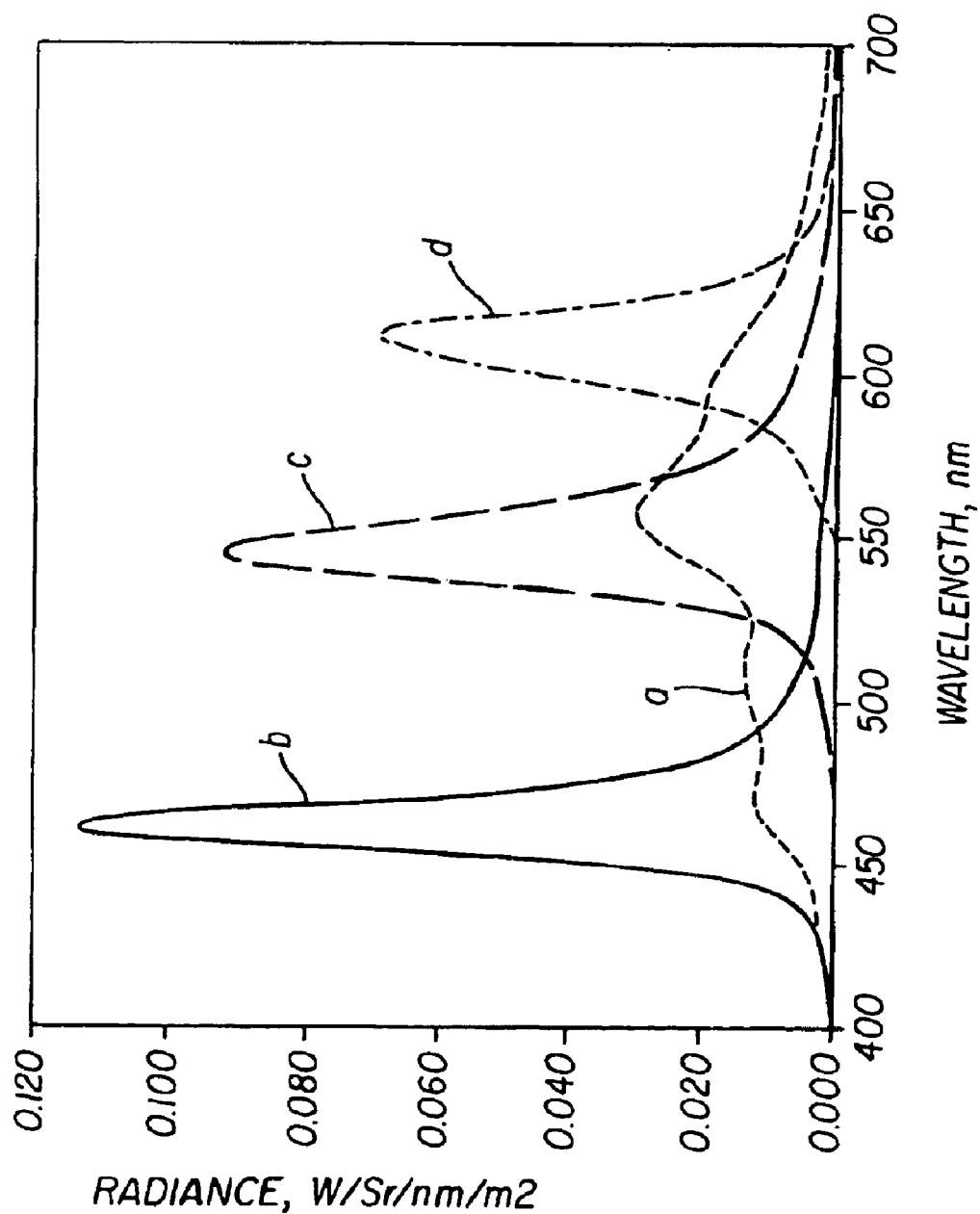
FIG. 6 shows the emission spectra of a non-cavity OLED device with a broadband emitter and three microcavity OLED devices using the same broadband emitter tuned to emit blue, green, and red colors, respectively.

At 20 $mA/cm^2$ this device requires a driving voltage of 7.9V, its emission output efficiency is 6.7 cd/A, and the color coordinates are CIE-x=0.376, CIE-y=0.461. The broad emission spectrum at 20 $mA/cm^2$ is shown as curve-a in FIG. 6.

For devices #8-2, #8-3, and #8-4, a glass substrate was coated with an anode layer, 93 nm thick, consisting of Ag, by a DC sputtering process at an Ar pressure of about 4 mTorr. A 3 nm thick layer of MoOx, was deposited on the clean Ag surface as the hole-injection layer by evaporation. The following layers were deposited in the following sequence by sublimation from a heated boat under a vacuum of approximately $10^{-6}$ Torr:

(1) an undoped hole transport layer consisting of N,N'-di(naphthalene-1-yl)-N,N'-diphenyl-benzidine (NPB), the thickness was 139 nm for device 8-2, 194.5 nm for device 8-3, and 217 nm for device 8-4, respectively;
(2) a doped hole transport and light emitting layer, 20 nm thick, consisting of N,N'-di(naphthalene-1-yl)-N,N'-diphenyl-benzidine (NPB) doped with 2.5% rubrene;
(3) a light-emitting layer, 20 nm thick, consisting of TBADN doped with 1.5% 4-(Di-p-Tolylamino)-4'-[(di-p-tolylamino)styryl]stilbene;
(4) an electron transport layer 20 nm thick, consisting of tris(8-hydroxyquinoline)aluminum(III) (Alq); and
(5) an electron-injection layer, 1 nm thick, consisting of Li;
(6) a cathode, approximately 22.5 nm thick, consisting of Ag.

After the deposition of these layers, the device was transferred from the deposition chamber into a dry box for encapsulation. The completed device structure is denoted as Glass/Ag(93)/MoOx(3)/NPB(varied)/NPB:2.5% rubrene (20)/TBADN:1.5% 4-(Di-p-Tolylamino)-4'-[(di-p-tolylamino)styryl]stilbene (20)/Alq(20)/Li(1)/Ag(22.5). The measured performance parameters are listed in Table 7, and the emission spectra are shown as curve-b, cure-c, and curve-d in FIG. 6.

TABLE 7

| | Voltage, volts | Luminance, Cd/m2 | Current Efficiency Cd/A | CIE-x | CIE-y | Peak Wavelength, nm | Emission Output Efficiency, W/Sr/m2, cavity | Emission Output Efficiency, W/Sr/m2, no cavity |
|---|---|---|---|---|---|---|---|---|
| Device #8-1 | 7.9 | 1339 | 6.70 | 0.376 | 0.461 | NA | | |
| Device #8-2 | 6.6 | 262 | 1.31 | 0.145 | 0.079 | 460 | 2.46 | 0.41 |
| Device #8-3 | 7.0 | 1914 | 9.57 | 0.336 | 0.647 | 544 | 2.61 | 1.26 |
| Device #8-4 | 9.0 | 811 | 4.06 | 0.546 | 0.312 | 608 | 1.98 | 0.99 |

From the broadband emitter in a non-cavity OLED structure device #8-1, a broadband emission (FIG. 6, curve-a) was obtained. By constructing microcavity structures #8-2, #8-3, #8-4 with different cavity length, devices that emits blue, green, and red, respectively, with good color quality were obtained. In addition, the emission output efficiency was drastically improved. Device #8-2 (FIG. 6, curve-b) has a peak wavelength of 460 nm and an emission output efficiency of 2.46 $W/Sr/m^2$, which is about 6 times the emission output efficiency, 0.41 $W/Sr/m^2$, of the baseline non-microcavity device #8-1 at this wavelength. Device #8-3 (FIG. 6, curve-c) has a peak wavelength of 544 nm and an emission output efficiency of 2.46 $W/Sr/m^2$, which is more than 2 times of the emission output efficiency, 1.26

W/Sr/m², of the baseline non-microcavity device #8-1 at this wavelength. Device #8-4 (FIG. 6, curve-d) has a peak wavelength of 608 nm and an emission output efficiency of 1.98 W/Sr/m², which is about 2 times the emission output efficiency, 0.99 W/Sr/m², of the baseline non-microcavity device #8-1 at this wavelength. Devices #8-2, #8-3, and #8-4 were individual OLED devices, but similar color selection and efficiency enhancement would be expected if these devices were pixels of an organic light-emitting display. The cavity length of the microcavities for devices #8-2, #8-3, and #8-4 was adjusted by changing the HTL thickness, but similar results would be expected if a transparent conductive phase-layer were used in these devices and only the thickness of the transparent conductive phase-layer were changed.

The invention has been described in detail with particular reference to certain preferred embodiments thereof, but it will be understood that variations and modifications can be effected within the spirit and scope of the invention.

PARTS LIST 10 substrate
12a transparent bottom-electrode
12T semitransparent metallic bottom-electrode
12R reflective metallic bottom-electrode
14 organic EL element
14a hole-injection layer
14b hole transport layer
14c light-emitting layer
14d electron transport layer
14e electron-injection layer
16a transparent top-electrode 16T semitransparent metallic top-electrode
16R reflective metallic top-electrode
18 QWS (quarter wave stack) reflecting mirror
20 transparent conductive phase-layer
22 absorption-reduction layer
101 conventional bottom-emitting OLED device
102 QWS based microcavity OLED device
103a microcavity OLED device
103b bottom-emitting OLED device without microcavity
103c QWS based bottom-emitting microcavity OLED device
103d all Ag electrodes bottom-emitting microcavity OLED device with an absorption-reduction layer
104a all Ag electrodes top-emitting microcavity OLED device
104b top-emitting OLED device without microcavity
104c QWS based top-emitting microcavity OLED device
104d all Ag electrodes top-emitting microcavity OLED device with an absorption-reduction layer

What is claimed is:

1. A color organic light-emitting display device having an array of pixels divided into at least two different color pixel sets, each color pixel set emitting a different predetermined color light over a common substrate, wherein each pixel in the array includes:
   a metallic bottom-electrode layer disposed over the substrate;
   a metallic top-electrode layer spaced from the metallic bottom-electrode layer;
   an organic EL element disposed between the top-electrode layer and the bottom-electrode layer and arranged to produce broadband light; and
   a transparent conductive phase-layer disposed between the metallic bottom-electrode layer and the organic EL element;
   wherein the organic EL element is common for all color pixels; wherein the thickness of the transparent conductive phase-layer is separately selected for pixels in different color pixel sets to cause the pixels in different color pixel sets to emit the different predetermined color light; wherein one of the metallic electrode layers is semitransparent and the other one is essentially opaque and reflective; wherein the material for reflective metallic electrode layer includes Ag, Au, Al, or alloys thereof, the material for the semitransparent metallic electrode layer includes Ag, Au, or alloys thereof; and wherein the thickness of the semitransparent metallic electrode layer, the combined thickness of organic layers of the organic EL element and the transparent conductive phase-layer, and the placement of a light-emitting layer of the organic EL element are selected so that each pixel in the display forms a tuned microcavity OLED device having an emission output efficiency above that of a comparable OLED device without the microcavity.

2. The color organic light-emitting display according to claim 1 wherein both the metallic electrode layers are Ag or alloys thereof and the thickness of the semitransparent electrode layer is between 10 nm and 30 nm.

3. The color organic light-emitting display according to claim 1 wherein the bottom-electrode layer is semitransparent and the light is emitted through the substrate.

4. The color organic light-emitting display according to claim 3 wherein the device further includes a high index of refraction absorption-reduction layer disposed between the semitransparent bottom-electrode layer and the substrate.

5. The color organic light-emitting display according to claim 4 wherein the absorption-reduction layer has an index of refraction greater than 1.6.

6. The color organic light-emitting display according to claim 4 wherein the material for the semitransparent electrode further includes Al, Cu, alloys thereof, or MgAg alloys with less than 50% Ag.

7. The color organic light-emitting display according to claim 1 wherein the top-electrode layer is semitransparent and the light is emitted through the semitransparent top-electrode layer.

8. The color organic light-emitting display according to claim 7 wherein the device further includes a high index of refraction absorption-reduction layer disposed over the semitransparent top-electrode layer.

9. The color organic light-emitting display according to claim 8 wherein the absorption-reduction layer has an index of refraction greater than 1.6.

10. The color organic light-emitting display according to claim 8 wherein the material for the semitransparent electrode further includes Al, Cu, alloys thereof, or MgAg alloys with less than 50% Ag.

11. The color organic light-emitting display according to claim 1 wherein the bottom-electrode layer is the anode and the top-electrode layer is the cathode.

12. The color organic light-emitting display according to claim 1 wherein the bottom-electrode layer is the cathode and the top-electrode layer is the anode.

13. The color organic light-emitting display according to claim 1 wherein the thickness of at least one of the organic layers other than the light-emitting layer is changed for each color pixel set.

14. The color organic light-emitting display according to claim 1 wherein the organic EL element includes a hole transport layer.

15. The color organic light-emitting display according to claim 14 wherein the thickness of the hole transport layer is changed for each color pixel set.

16. The color organic light-emitting display according to claim 1 wherein the organic EL element includes an electron transport layer.

17. The color organic light-emitting display according to claim 16 wherein the thickness of the electron transport layer is changed for each color pixel set.

18. The color organic light-emitting display according to claim 1 wherein the organic EL element further includes an electron-injection layer.

19. The color organic light-emitting display according to claim 1 wherein the organic EL element further includes a hole-injection layer.

20. The color organic light-emitting display of claim 1 that is an active-matrix display.

21. The color organic light-emitting display of claim 1 that is a passive matrix display.

22. The color organic light-emitting display of claim 1 wherein the organic EL element contains at least small-molecule OLED material.

23. The color organic light-emitting display of claim 1 wherein the organic EL element contains at least polymeric OLED material.

24. The color organic light-emitting display of claim 1 wherein the organic EL element contains fluorescent OLED material.

25. The color organic light-emitting display of claim 1 wherein the organic EL element contains phosphorescent OLED material.

* * * * *